US006680788B1

(12) United States Patent  
Roberson et al.

(10) Patent No.: US 6,680,788 B1  
(45) Date of Patent: Jan. 20, 2004

(54) SCANNING APPARATUS AND ASSOCIATED METHOD (75) Inventors: Mark Windsor Roberson, Cary, NC (US); David Edward Dausch, Raleigh, NC (US)

(73) Assignee: MCNC, Research Triangle Park, NC (US)

( * ) Notice: Subject to any disclaimer, the term of this patent is extended or adjusted under 35 U.S.C. 154(b) by 298 days.

(21) Appl. No.: 09/689,557

(22) Filed: Oct. 12, 2000

(51) Int. Cl.[7] ............................................. G02B 26/08
(52) U.S. Cl. ..................... 359/210; 359/204; 372/20; 372/50
(58) Field of Search ................... 372/50, 20; 356/3.09, 356/3.12, 4.01; 369/44.37, 121; 359/209, 210, 196, 197; 385/16

(56) References Cited

U.S. PATENT DOCUMENTS

| 4,633,445 A |   | 12/1986 | Sprague |
|---|---|---|---|
| 5,325,386 A | * | 6/1994 | Jewell et al. .................. 372/50 |
| 5,436,871 A |   | 7/1995 | Russell |
| 5,479,384 A |   | 12/1995 | Toth et al. |
| 5,525,810 A |   | 6/1996 | Jewell et al. |
| 5,696,714 A |   | 12/1997 | Russell |
| 5,781,671 A | * | 7/1998 | Li et al. ........................ 385/17 |
| 5,870,227 A |   | 2/1999 | Rope et al. |
| 5,956,070 A |   | 9/1999 | Paoli et al. |
| 6,005,817 A |   | 12/1999 | Gudesen et al. |
| 6,091,537 A | * | 7/2000 | Sun et al. .................... 359/248 |

* cited by examiner

*Primary Examiner*—Euncha Cherry  
(74) *Attorney, Agent, or Firm*—McDermott, Will & Emery (57) ABSTRACT

A scanning apparatus adapted to track or other wise communicate with a remote object is provided, comprising a plurality of individually actuatable laser devices, each laser device emitting a laser beam. The scanning apparatus further comprises a moveable lens member disposed adjacent to the output ports such that the laser beams are directed therethrough, the lens member being moveable and cooperable with the laser devices such that each laser beam is directed in a different direction after passing through the lens member. The scanning apparatus is further configured to provide laser beam agility by selectively actuating individual laser devices so as to coarsely track the remote object and to provide laser beam steerability by moving the lens member with respect to an actuated laser device so as to finely track the remote object. An associated method is also provided.

30 Claims, 6 Drawing Sheets

SCANNING APPARATUS AND ASSOCIATED METHOD

FIELD OF THE INVENTION

The present invention relates to the field of optical beam steering and, more particularly, to a scanning apparatus and associated method using vertical-cavity surface-emitting lasers (VCSELs) and a movable lens to provide a steerable agile beam.

BACKGROUND OF THE INVENTION

Detecting, tracking, and/or communicating with an object moving within a spatial field, also known as a field of search, has many practical and strategic military and commercial applications. Interaction with such a moving object typically involves directing a single detection beam in a raster pattern so as to scan the beam over the field of search. That is, the detection beam is usually guided in a continuous serial pattern such that it is scanned over the search field to cover the entire area thereof If a portion of the detection beam is reflected, an object will likely have been detected by the detection beam during a scan of the search field. However, additional data relating to the object, such as speed and trajectory, may not be determinable until the detection beam has completed the raster scan and returned to the location of the object in the search field. As such, in certain applications, such as military applications, where moving objects may be traveling at a rate of several times the speed of sound, a raster scan detection system may be too slow to be of practical use with modern systems which are continuously increasing in processing speed. Thus, there exists a need for a system capable of scanning, detecting, and/or communicating with a moving object in a faster, more accurate, and more efficient manner than a raster system.

In addition, a raster system typically requires complex mechanisms and controls for moving the detection beam in the desired raster pattern. For example, where the search field is a square box, the raster pattern may comprise lateral movement of the beam in an alternating manner across the width of the box, with a longitudinal shift equal to the width of the beam with each lateral reversal of the direction of the beam. Such a scan may start at one corner of the box and end at the opposite diagonal corner, where the beam then reverts back to the initial corner to begin the next scan of the search field. Accordingly, the associated mechanisms and controls may be complex and are usually required to be both accurate and durable in order to maintain precise and optimum operation of the detection system. Thus, there exists a further need for a system capable of scanning, detecting, and/or communicating with a moving object that has a simpler operational mechanism, compared to a raster system, with sufficient accuracy and durability to provide a precise detection system.

In certain applications, such scanning, detection, and/or communications systems may be subject to a harsh environment, wherein the system may be exposed to, for example, severe vibrations, g-forces, jarring, and/or impact. Such environmental factors may be detrimental to the performance of a raster-type system. Thus, there exists a further need for a system capable of scanning, detecting, and/or communicating with a moving object that has a simpler and more robust configuration, compared to a raster system, so as to provide a precise and reliable detection system, even in harsh environments.

An example of such a scanning, detection, and/or communication system is disclosed by U.S. Pat. No. 5,909,296 to Tsacoyeanes. The '296 patent discloses wide angle beam steering using spherical laser diode arrays. A curved array of lasers causes discrete narrow infrared light beams to be projected within a wide field of view, without requiring mechanical motion of components. However, the Tsacoyeanes device may be difficult to produce due to the precise hemispherical configuration in which the lasers must be placed in order to provide the desired accuracy. In addition, the hemispherical configuration may produce a device having undesirable minimum size constraints as well as a disadvantageous maximum laser density constraint. Further, as disclosed, the Tsacoyeanes device relies upon alignment of individual laser beams with the target in order for the device to function as intended. A gap may therefore exist between adjacent laser elements such that less-than-optimum resolution may be obtained as the device shifts from one laser element to the next. Thus, where an array-type device is used, there exists a need for the system to be capable of transitioning between adjacent laser devices in a "seamless" manner and without a significant loss of resolution.

Thus, there exists a need for a detection/communication system capable of scanning, detecting, and/or communicating with a moving object in a faster, more accurate, and more efficient manner than a raster system. Such a system should also have a simpler operational mechanism with sufficient accuracy and durability to provide a precise detection system and a more robust configuration such that the detection system is reliable, even in harsh environments. In instances where such a system is accomplished by use of an array-type device, the system should be capable of transitioning between adjacent laser devices in a "seamless" manner without a significant loss of resolution.

SUMMARY OF THE INVENTION

The above and other needs are met by the present invention which, in one embodiment, provides a scanning apparatus for tracking a remote object that is typically moving within a predetermined distance range. A plurality of individually actuatable laser devices are provided, typically in the form of an array, for emitting laser beams. A moveable lens member is disposed proximate to the laser devices such that the laser beams are directed therethrough. The lens member is moveable and cooperable with the laser devices such that each laser beam is directed in a different direction after passing through the lens member. The apparatus is therefore configured to provide laser beam agility by selectively actuating the laser devices and to provide laser beams steerability by moving the lens member with respect to the laser devices.

According to one advantageous embodiment of the present invention, the laser devices comprise vertical-cavity surface-emitting lasers (VCSELs), wherein, in some instances, the VCSELs are solder-bumped to a substrate so as to form a fine pitch, solder-bumped VCSEL array. According to some embodiments, the laser devices may be arranged in a substantially planar array. In other instances, a plurality of sub-arrays of VCSELs may be combined to form the array.

The lens member is disposed in spaced parallel relation to the array and is moveable within a plane corresponding thereto. The lens member may be moved by at least one actuator in communication therewith, such as a piezoelectric actuator. In this configuration, the laser devices are also individually and selectively actuatable such that sequential actuation of individual laser devices coarsely attunes the laser beams to a corresponding trajectory of the moving object to enable the apparatus to track the moving object. Movement of the lens member with respect to an actuated laser device thereafter finely attunes the corresponding laser beam to the trajectory. As such, the scanning apparatus of the present invention can reliably track moving objects in a rapid manner without using a single laser device to raster scan through the entire area of interest.

According to advantageous embodiments, the lens member is configured to cooperate with the laser beams to provide a predetermined magnitude of angular coverage depending on the desired configuration and capabilities of the apparatus. Accordingly, the apparatus is capable of tracking moving objects within a distance range of between about 500 meters and about 2500 meters. In some instances, the apparatus may further comprise a controller capable of individually and selectively actuating the laser devices, wherein sequential actuation of individual laser devices by the controller coarsely attunes the respective laser beams to a corresponding trajectory such that the apparatus is capable of tracking a moving object. The controller may also be configured to direct movement of the lens member with respect to the laser devices so as to finely attune the laser beams to the trajectory. The apparatus may further comprise a detection device for detecting signals from the remote object. In some instances, the controller may be responsive to the detection device so as to actuate the laser devices and move the lens member in order to track the remote object.

Another advantageous aspect of the present invention comprises a method of tracking remote objects. First, an array of laser devices capable of emitting laser beams therefrom is provided in spaced relation to a moveable lens member to form a scanning apparatus configured such that the laser beams are directed through the lens member. The lens member is configured so as to direct each laser beam in a different direction. Selected laser devices are thereafter sequentially actuated such that the emitted laser beams directed through the lens member are coarsely attuned to a trajectory of a remote object. The lens member may also be selectively moved with respect to an actuated laser device such that the laser beam emitted thereby is finely attuned to the trajectory of the remote object.

In some instances, a solder-bumped array of vertical-cavity surface-emitting lasers (VCSELs) is provided in spaced relation to the moveable lens member. In further instances, the method may include interacting with the remote object by transmitting signals to the remote object and receiving signals from the remote object, wherein the received signals may comprise reflections of the laser beams. In response to the signals received from the remote object, a selected laser device may be actuated and/or the lens member moved so as to facilitate communication with the remote object.

Thus, a scanning apparatus and method according to embodiments of the present invention provides a detection/communication system and method capable of scanning, detecting, and/or communicating with a remote object in a faster, more accurate, and more efficient manner than a raster system since the plurality of laser devices allows a multiplexed approach to examining the area of interest. Embodiments of a scanning apparatus according to the present invention also provide a simpler operational mechanism, as a result of selective actuation of individual laser devices having at least a reduced amount of moving parts compared to a raster system, with increased accuracy and lower scanning and detection times, while being durable and robust so as to provide a precise detection system that is reliable, even in a harsh environment. Both the coarse and fine attunement provisions provide more accurate tracking and allow for transitions between adjacent laser devices in a relatively seamless manner, without a significant loss of resolution. Therefore, embodiments of a scanning apparatus and method according to the present invention provide advantages over conventional detection/communication systems.

BRIEF DESCRIPTION OF THE DRAWINGS

Some of the advantages of the present invention having been stated, others will appear as the description proceeds, when considered in conjunction with the accompanying drawings, which are not necessarily drawn to scale, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
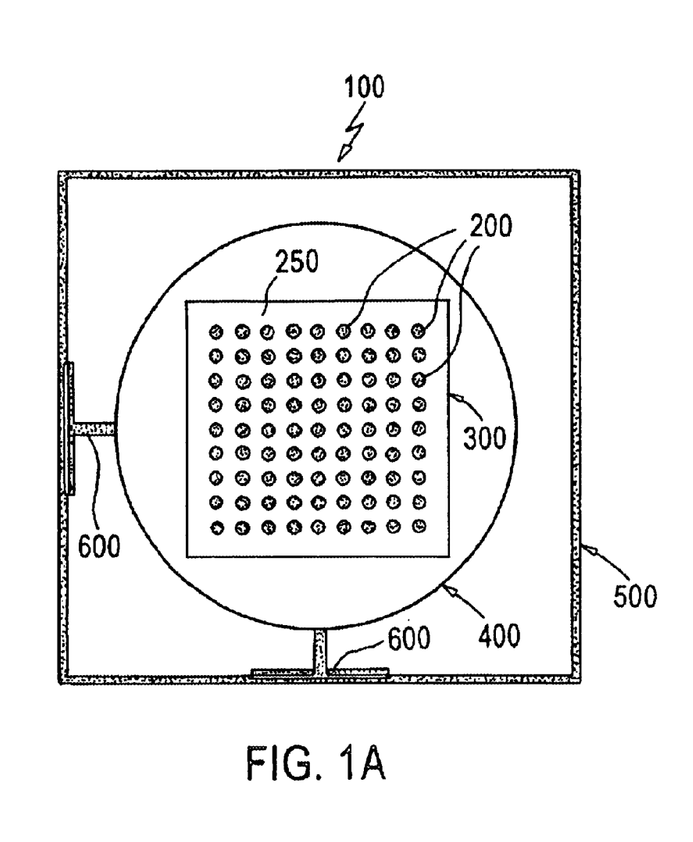
FIGS. 1A and 1B are schematic representations of a scanning apparatus according to one embodiment of the present invention.
Figure 1B:
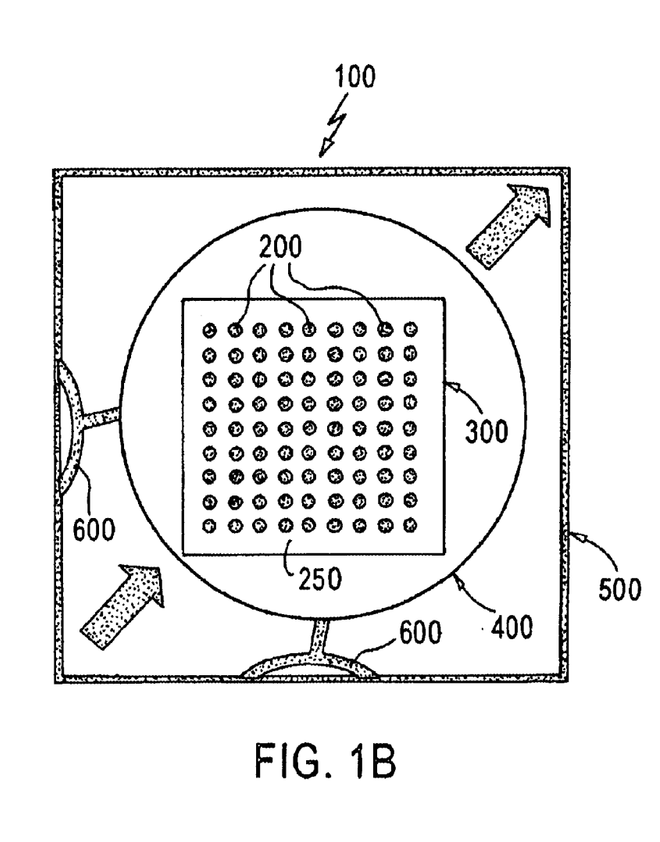

FIGS. 1A and 1B schematically illustrate one embodiment of a scanning apparatus, indicated generally by the numeral 100, which includes the features of the present invention. The scanning device 100 comprises a plurality of individually actuatable laser devices 200 wherein, according to one embodiment, the laser devices 200 are arranged in an array 300. Disposed adjacent to the array 300 is a moveable lens member 400, wherein laser beams produced by each laser device 200 are directed to pass through the lens member 400. Still further, according to one embodiment of the present invention, the lens member 400 may be moveable within a reference frame 500 via one or more actuators 600 operably engaged therebetween, as indicated by FIG. 1B.

According to one advantageous aspect of the present invention, the laser devices 200 comprise vertical-cavity surface-emitting lasers (VCSELs), wherein each VCSEL may, for example, comprise a monolithic growth on an indium phosphide (InP) substrate. The VCSEL may include, for instance, InGaAs or strain-compensated InGaAs quantum wells surrounded by high bandgap InAlGaAs cladding layers. One advantageous VCSEL is made by Picolight, Inc. of Boulder, Colo., USA and is commercially available under the name "Gigabit Per Second Vertical Cavity Surface Emitting Laser." VCSEL devices are known to those skilled in the art and will not be further detailed herein. In some instances, the VCSEL operates on a 1550 nm wavelength and is optimized for eye-safe single-mode emission in order to provide a single beam with a narrow divergence angle.

In order to form the array 300, a plurality of VCSELs 200 are mounted on a substrate 250, such as a silicon or sapphire substrate with any necessary interconnects and, in some instances, active drive circuitry, wherein the VCSELSs 200 are mounted using, for example, a solder-bump process. Such a solder-bump process is known to those skilled in the art and is the subject of U.S. Pat. Nos. 4,950,623, 4,921,157, 5,289,631, 5,615,825, 5,162,257, 5,237,434, 5,407,121, 5,767,010, 5,892,179, 5,902,686, and 5,793,116, all assigned to the Microelectronics Center of North Carolina (also known as "MCNC"), the assignee of the present invention. According to one advantageous aspect of the present invention, the array 300 may be formed in a batch wafer fabrication process to provide, for example, an array of 400(20×20) VCSEL elements 200 solder bumped to a substrate 250 to form an array with a fine pitch of approximately 100 micrometers, thereby providing an overall array size of about 2–3 mm by 2–3 mm. The array 300 is thereby fabricated to be substantially planar and, in some instances, may be configured such that the laser beams are emitted from a substantially planar surface.

Figure 2:
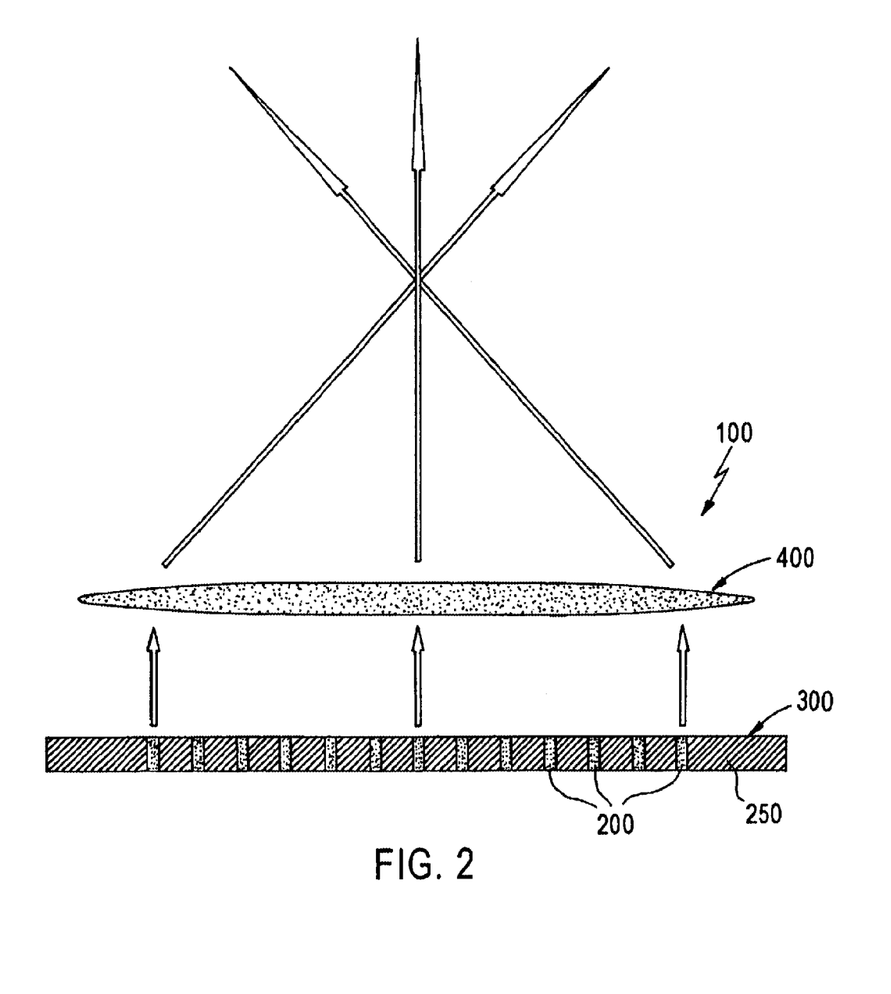
FIG. 2 is a schematic representation of a scanning apparatus according to one embodiment of the present invention illustrating the effect of the lens member on laser beams emitted from laser devices within the array.

The lens member 400 is disposed adjacent to the array 300 and, in some instances, in spaced parallel relation as shown in FIG. 2. The lens member 400 may be, for example, derived from a positive (converging) lens and is positioned at distance equal to its focal length from the array 300. In one embodiment, the lens member 400 has a focal length of and is disposed about 15 mm away from the array 300. Each laser beam emitted from a corresponding VCSEL 200 through the lens member 400 will therefore be directed in a different direction after passing through the lens member 400. According to one advantageous aspect of the present invention, several sub-arrays may be grouped together to form the array 300 and combined with an appropriate lens member 400 such that each individual VCSEL 200 produces a laser beam which covers an area of, for example, less than a square degree, after the laser beam passes through the lens member 400 and reaches the desired range. In some instances, the range may be between, for example, about 500 meters and about 2500 meters, although the scanning apparatus 100 can be readily configured for other ranges, if desired. The lens member 400 is further configured such that both microdiffractive and macroscopic refractive optics correct for beam divergence and reduce side lobe emissions so as to increase the usable range of the VCSEL 200 for targeting and communication, while reducing the possibility of the laser beam being intercepted. Thus, it is understood that the lens member 400 may have many different configuration depending on the particular characteristics required, wherein the lens members may comprise, for example, multiple lens elements such as singlet, doublet, triplet, and aspheric lens elements as well as diffractive elements.

According to one embodiment of the present invention, the lens member 400 is arranged within a framework 500 which may, for example, serve as both a support for the lens member 400 as well providing a positional reference between the array 300 and the lens member 400. Supporting the lens member 400 within the framework 500 are one or more actuators 600 operably engaged therebetween. Such actuators 600 serve to render the lens member 400 moveable within the framework 500 and with respect to the underlying array 300. The actuator 600 may comprise, for example, parallel and series bimorphs, unimorphs, and high-displacement bender-type actuators. According to one embodiment, edge-mounted piezoelectric bender-type actuators are used in order to provide a large planar displacement for moving and controlling the position of the lens member 400. The piezoelectric actuators 600 may provide, for example, 200 micrometers or more of travel distance for the lens member 400. Piezoelectric actuators are commercially available from several sources, including Piezo Systems, Inc. of Cambridge, Mass.

Figure 3:
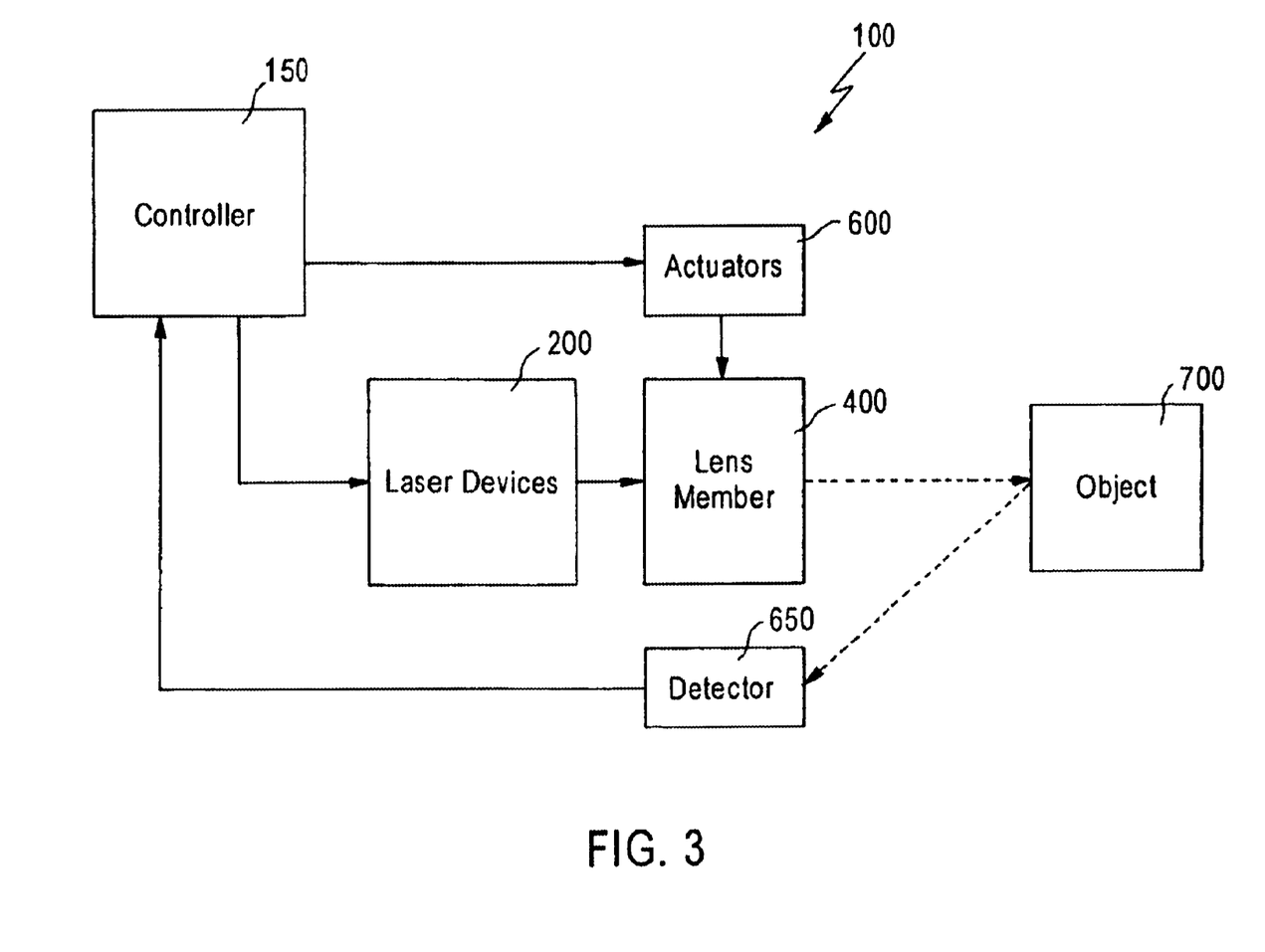
FIG. 3 is a block diagram representation of a scanning apparatus according to one embodiment of the present invention.

As depicted in FIG. 3, the scanning apparatus 100 also preferably includes a controller 150, such as a microcontroller or a PC/104 type computer. Among other capabilities, the controller 150 actuates the laser devices 200 to emit laser signals, typically using high voltage drivers, such as high voltage operational amplifiers (not shown), and selectively energizes the actuators 600 to controllably position the lens member 400.

Figure 4A:
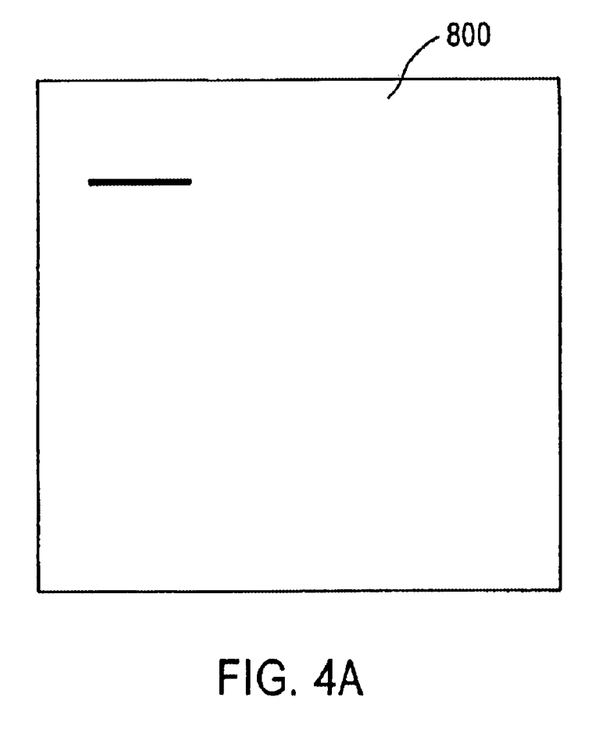
FIG. 4A is a schematic representation of a conventional raster scan process.
Figure 4B:
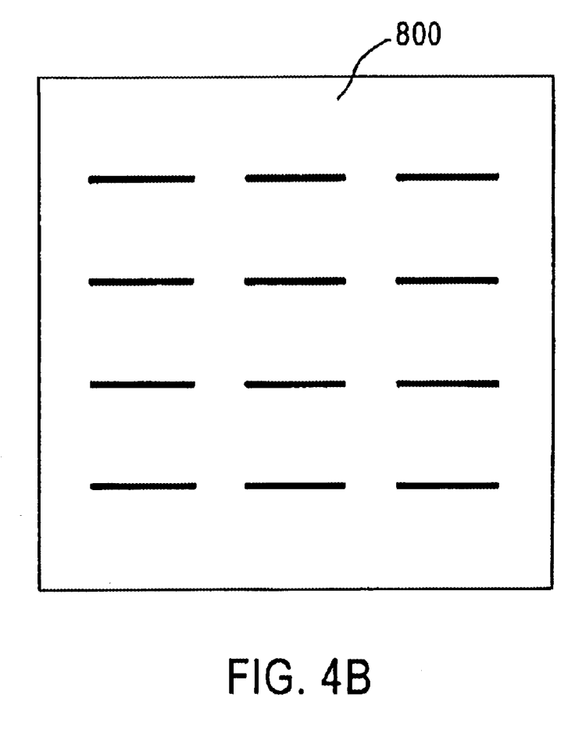
FIG. 4B is a schematic representation of a multiplexed scan process used by a scanning apparatus according to one embodiment of the present invention.

The scanning apparatus 100, according to embodiments of the present invention, may be used for several different purposes. For example, the individual VCSELs 200 may be simultaneously actuated so as to provide a multiplexed approach to scanning a particular field. FIG. 4A shows a field 800 being scanned in a conventional raster pattern by a single beam (beginning in the upper left corner of the field and moving toward the upper right hand corner thereof), wherein the single beam must cover the entire field 800 in a serial pattern in order to scan the entire area thereof. In contrast, FIG. 4B shows a multiplexed scanning approach according to embodiments of the present invention, wherein simultaneous actuation of the VCSELs 200 within the array 300 provides a fast and complete scan of the field 800 since each VCSEL 200 simultaneously scans only a small area (schematically indicated by the separate black lines) of the entire field 800. In such instances, the use of a multiplexed scanning process increases the speed of the scanning apparatus 100 by several orders of magnitude, for example, 1000 times, over a comparable conventional raster scanning system.

Figure 5:
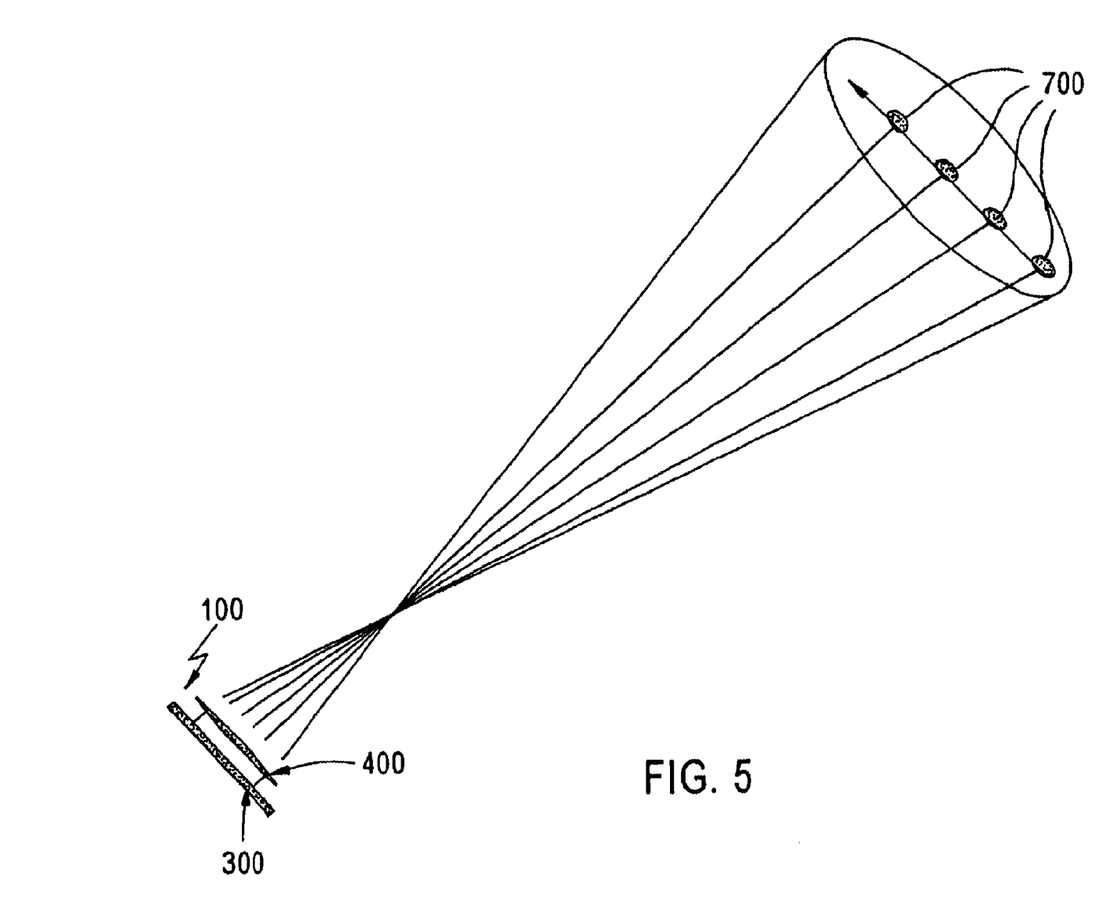
FIG. 5 is a schematic representation of a scanning apparatus according to one embodiment of the present invention illustrating a range of coverage of the array of laser devices and the capability of tracking a moving object within that range.

FIG. 5 shows another application of the scanning apparatus 100, wherein the apparatus 100 is used to track a remote target or object 700 that is typically moving. As shown, the scanning apparatus 100 is capable of covering a wide angular area due to the directing of the laser beams by the lens member 400. Such an area of coverage may include, for example, a 45° field for an apparatus configured to cover a wide field of view or a 1° field where a precision angular alignment is required. Note that the angular fields described herein are merely examples and it will be understood that the apparatus 100 may be configured in many different manners to produce angular fields of coverage that are wider or more minute and precise as necessary in accordance with the spirit and scope of the present invention. Where the scanning apparatus 100 locks onto the target 700, the target 700 may be coarsely tracked by sequentially actuating appropriate VCSELs 200 that correspond to the track of the target 700. The actuated VCSELs 200 may be, for instance, adjacent VCSELs 200 in the array 300 where the target 700 is moving in a slow trajectory at a large range with respect to the scanning apparatus 100. Where the target 700 is closer in range to the apparatus,100 or moving at a faster rate, the appropriate VCSELs 200 may be more widely spaced about the array 300. While the target 700 passes through the small area of the field covered by a respective laser device 200, the laser device 200 can lock onto the target 700 and be fine-tuned to closely follow the target 700 by controllably moving the lens member 400 as described below.

Figure 6A:
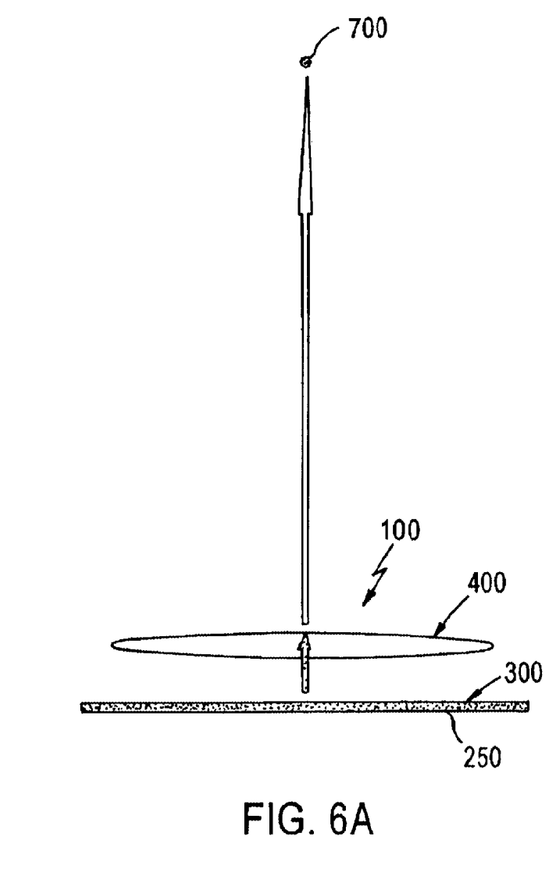
FIG. 6A is a schematic representation of a scanning apparatus according to one embodiment of the present invention illustrating a laser beam coinciding with a target.

As shown in FIG. 6A, once an individual VCSEL 200 is actuated, the laser beam passes through the lens member 400 and is directed in a known direction to engage a mobile target 700. As described above, the structure of the scanning apparatus 100 designates each VCSEL 200 to serve a certain area which, in some instances, comprises less than a square degree within the specified range of the apparatus 100 of between about 500 meters and about 2500 meters. Thus, each VCSEL 200 serves a predetermined angular cell of travel for the target 700. However, as the target 700 moves within that cell, the focus of the laser beam may vary, thereby leading to a less than optimum signal strength in some portions of the cell. The loss of signal strength is detected with a detector 650, such as, for example, a p-i-n detector, wherein at least a portion of one such detector 650 is typically associated with each laser device 200. The detector 650 is typically mounted on the substrate 250 and detects signals, such as signals reflected from the target 700. The controller 150 preferably monitors the output of the detector 650 as shown in FIG. 3 so as to determine any change in the signal strength.

Figure 6B:
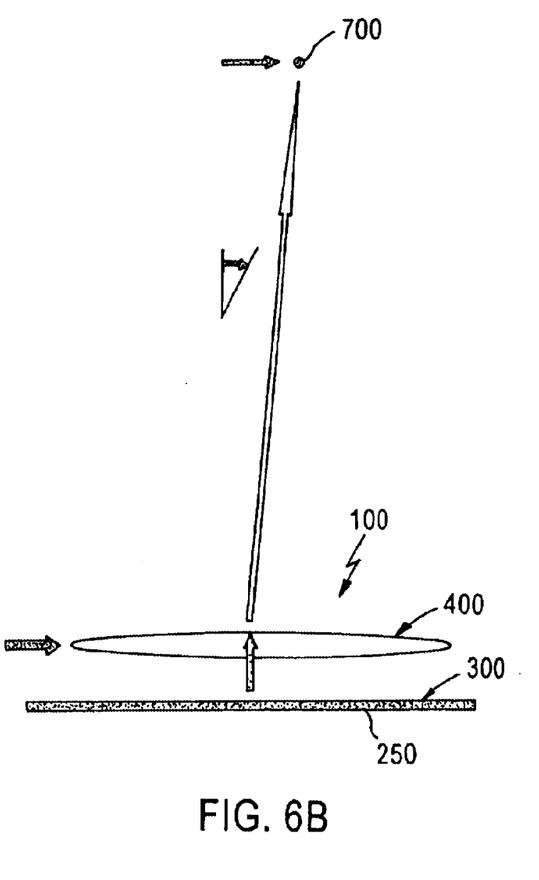
FIG. 6B is a schematic representation of a scanning apparatus according to one embodiment of the present invention illustrating a laser beam being steered to coincide with a target, by moving the lens member, after the target has shifted such that the target no longer coincides with the laser beam.

In instances where the target 700 remains within the designated cell, but the signal strength has decreased, the actuator 600 is actuated as shown in FIG. 6B such that the lens member 400 is moved with respect to the actuated VCSEL 200. Controlled movement of the lens member 400 with respect to the actuated VCSEL 200 steers the laser beam in the direction of the target 700 so as to provide higher or optimum beam quality on the target 700, as determined by greater signal strength at the detector 650. In some instances, the piezoelectric actuator 600 is capable of fine tuning the angular position of the laser beam within a millisecond. Thus, the sequential actuation of different VCSELs 200 provides a coarse tracking mechanism for tracking the target 700 from one cell to another as shown in FIG. 5, while optical beam steering using the change in the position of the lens member 400 with respect to the actuator 600 provides fine tracking of the target 700 within a particular angular cell. Where the laser beams are locked onto a target 700, the scanning apparatus 100 may also be used to transmit data or other signals therebetween at a data transmission rate of, for example, 1 Gb/s. In order to accomplish interaction between the apparatus 100 and the target 700, the detector 650 may also serve to receive and/or detect the signals transmitted by the target 700.

A scanning apparatus 100 according to embodiments of the present invention may have many different configurations and be used for a variety of other purposes. For example, the array 300 may be part of a larger module which comprises a plurality of similar arrays. The lens member 400 may also be configured as, for example, an array of lens members with each lens member in the array corresponding to a particular VCSEL 200. In further instances, the actuator 600 may be operably engaged with the lens member 400 to move the lens member 400 in different manners within, for example, a plane substantially parallel to the array 300 or in a plane disposed perpendicularly thereto. As for other applications, the scanning apparatus 100 may be used in the multiplexed scanning approach to, for example, track a plurality of moving targets 700.

Thus, a scanning apparatus 100 according to embodiments of the present invention provides a detection/communication system capable of scanning, detecting, and/or communicating with a moving object in a faster, more accurate, and more efficient manner than a raster system. Such a scanning apparatus 100 also provides a simpler operational mechanism that is accurate and durable and provides a robust configuration, wherein the resulting system is precise and reliable, even in harsh environments. Embodiments of the present invention also provide an array-type device that provides both a coarse tracking mechanism as well as a fine tracking mechanism and therefore allows tracking of a target in a "seamless" manner while maintaining optimum resolution during the tracking process.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A scanning apparatus, comprising:
   a plurality of individually actuatable laser devices for emitting respective laser beams, selective actuation of individual laser devices thereby providing laser beam agility;
   a laterally movable macrolens member disposed adjacent to the laser devices such that the laser beams are directed therethrough, the macrolens member being cooperable with the laser devices such that each laser beam is directed in a different direction after passing through the macrolens member; and
   at least one piezoelectric actuator operably engaged with the macrolens member and configured to laterally move the macrolens member with respect to the laser devices so as to provide laser beam steerability.

2. A scanning apparatus according to claim 1 wherein the macrolens member is laterally movable within a plane disposed in spaced parallel relation to the laser devices.

3. A scanning apparatus according to claim 2 wherein the laser devices comprise an array of vertical-cavity surface-emitting lasers (VCSELs).

4. A scanning apparatus according to claim 3 further comprising a substrate on which the laser devices in the array are mounted by solder-bumping.

5. A scanning apparatus according to claim 2 wherein the laser devices are arranged in a substantially planar array.

6. A scanning apparatus according to claim 5 wherein the array comprises a plurality of sub-arrays.

7. A scanning apparatus according to claim 1 wherein the macrolens member is configured to cooperate with the laser devices to track moving objects within a distance range of between about 500 meters and about 2500 meters.

8. A scanning apparatus according to claim 1 wherein the macrolens member is configured to cooperate with the laser devices to provide a predetermined magnitude of angular coverage.

9. A scanning apparatus according to claim 1 further comprising a controller capable of individually and selectively actuating the laser devices, wherein sequential actuation of individual laser devices by the controller coarsely attunes the respective laser beams to a corresponding trajectory such that the apparatus is capable of tracking a moving object.

10. A scanning apparatus according to claim 9 wherein the controller is further configured to direct the piezoelectric actuator to laterally move the macrolens member with respect to the laser devices so as to finely attune the laser beams to the trajectory.

11. A scanning apparatus according to claim 10 further comprising a detection device for detecting signals from a remote object.

12. A scanning apparatus according to claim 11 wherein the controller is responsive to the detection device so as to actuate the laser devices and direct the piezoelectric actuator to laterally move the macrolens member in order to track the remote object.

13. A scanning apparatus, comprising:
- a plurality of individually actuatable laser devices for emitting respective laser beams;
- a laterally movable macrolens member disposed adjacent to the laser devices such that the laser beams are directed therethrough, the macrolens member being cooperable with the laser devices such that each laser beam is directed in a different direction after passing through the macrolens member;
- at least one piezoelectric actuator in communication with the macrolens member for laterally moving the macrolens member; and
- a controller configured to individually and selectively actuate the laser devices and to actuate the at least one peizoelectric actuator,
- wherein sequential actuation of individual laser devices by the controller provides laser beam agility and actuation of the at least one peizoelectric actuator by the controller provides laser beam steerability by laterally moving the macrolens member with respect to the laser devices.

14. A scanning apparatus according to claim 13 wherein the macrolens member is laterally movable within a plane disposed in spaced parallel relation to the laser devices.

15. A scanning apparatus according to claim 14 wherein the laser devices comprise an array of vertical-cavity surface-emitting lasers (VCSELs).

16. A scanning apparatus according to claim 15 further comprising a substrate on which the laser devices in the array are mounted by solder-bumping.

17. A scanning apparatus according to claim 14 wherein the laser devices are arranged in a substantially planar array.

18. A scanning apparatus according to claim 17 wherein the array comprises a plurality of sub-arrays.

19. A scanning apparatus according to claim 13 wherein the macrolens member is configured to cooperate with the laser devices to track moving objects within a distance range of between about 500 meters and about 2500 meters.

20. A scanning apparatus according to claim 13 wherein the macrolens member is configured to cooperate with the laser devices to provide a predetermined magnitude of angular coverage.

21. A scanning apparatus according to claim 13 wherein the controller is configured to sequentially actuate individual laser devices so as to coarsely attune the respective laser beams to a corresponding trajectory to track a moving object.

22. A scanning apparatus according to claim 21 wherein the controller is further configured to direct the at least one piezoelectric actuator tolaterally move the macrolens member with respect to the laser devices so as to finely attune the laser beams to the trajectory.

23. A scanning apparatus according to claim 22 further comprising a detection device for detecting signals from a remote object.

24. A scanning apparatus according to claim 23 wherein the controller is responsive to the detection device so as to actuate the laser devices and to direct the at least one piezoelectlic actuator to laterally move the macrolens member in order to track the remote object.

25. A method of tracking a remote object, said method comprising:
- providing an array of laser devices capable of emitting laser beams therefrom in spaced relation to a laterally movable macrolens member to form a scanning apparatus configured such that the laser beams are directed through the macrolens member, the macrolens member being configured so as to direct each laser beam in a different direction;
- sequentially actuating selected laser devices such that the emitted laser beams directed through the macrolens member are coarsely attuned to a trajectory of the remote object; and
- selectively laterally moving the macrolens member with at least one piezoelectric actuator operably engaged therewith and with respect to all actuated laser device such that the laser beam emitted thereby is finely attuned to the trajectory.

26. A method according to claim 25 wherein providing the array of laser devices further comprises providing a solder-bumped array of vertical-cavity surface-emitting lasers (VCSELs) in spaced relation to the movable macrolens member.

27. A method according to claim 25 further comprising interacting with the remote object by transmitting signals to the remote object and receiving signals from the remote object.

28. A method according to claim 27 wherein receiving signals from the remote object comprises receiving reflections of the laser beams from the remote object.

29. A method according to claim 28 further comprising actuating a selected laser device in response to the signals received from the remote object.

30. A method according to claim 28 further comprising laterally moving the macrolens member with the at least one piezoelectric actuator in response to the signals received from the remote object.

* * * * *